US005124664A

United States Patent [19]

Cade et al.

[11] Patent Number: 5,124,664

[45] Date of Patent: Jun. 23, 1992

[54] FIELD EMISSION DEVICES

[75] Inventors: Neil A. Cade, Rickmansworth; David F. Howell, Maidenhead, both of England

[73] Assignee: The General Electric Company, p.l.c., England

[21] Appl. No.: 618,669

[22] Filed: Nov. 27, 1990

[30] Foreign Application Priority Data

Nov. 29, 1989 [GB] United Kingdom ................. 8926959

[51] Int. Cl.[5] ............................................ H03F 3/56

[52] U.S. Cl. ........................................ 330/45; 330/43; 330/46; 313/309; 313/336; 315/3.5; 331/83; 331/84

[58] Field of Search ........................ 330/43, 44, 45, 46, 330/49, 54; 331/82-84; 313/309, 336, 351; 315/3.5, 39.3

[56] References Cited

U.S. PATENT DOCUMENTS

| | | | |
|---|---|---|---|
| 4,091,332 | 5/1978 | Crandall | 330/43 |
| 4,780,684 | 10/1988 | Kosmahl | 330/54 |
| 4,901,028 | 2/1990 | Gray et al. | 330/54 |
| 4,967,162 | 10/1990 | Barnett et al. | 330/43 |

*Primary Examiner*—James B. Mullins

*Attorney, Agent, or Firm*—Kirschstein, Ottinger, Israel & Schiffmiller

[57] ABSTRACT

A klystron device comprises an array of cold-cathode field emission elements arranged to form a distributed amplifier which further comprises a modulation strip line and a catcher strip line. A collector electrode is spaced from the catcher strip line. The device may include a deflector for returning electrons emitted by the elements back to the modulation strip line so that the device acts as an oscillator.

17 Claims, 6 Drawing Sheets

FIELD EMISSION DEVICES

BACKGROUND OF THE INVENTION

1. Field of the Invention

This invention relates to field emission devices, and particularly to amplifier and oscillator devices which rely on field emission.

2. Description of Related Art

Although high-power microwave and millimeter-wave circuits having invariably involved the use of thermionic vacuum devices, most low-power high-frequency devices are now formed by conventional solid state techniques.

Transit time induced limitation of high frequency performance in vacuum electronic devices can usually be made negligibly small because of the ballistic electron motion in a vacuum. However, just as in solid state devices, the ultimate speed of operation of a vacuum device is likely to be capacitance limited. In conventional large-scale vacuum electronic devices, a number of particular designs have been developed to overcome this limitation. These designs involve some combination of velocity modulation and distributed amplification.

The combination of velocity modulation and a relatively long drift space can result in a spatial separation of fast and slow electrons. The bunching of electrons occurring as faster electrons overtake slower electrons emitted earlier can produce an approximately 50% modulation of the current at the frequency of a small modulating signal applied thereto. This forms the operational basis of the klystron. The main limitations to the gain available from such device are the energy spread of the electron beam prior to modulation and control of the momentum of the electrons both before and after modulation.

SUMMARY OF THE INVENTION

It is an object of the present invention to provide a small microwave or millimeter-wave device which is fabricated by semiconductor fabrication techniques, but which produces an electron beam in vacuum to allow high-frequency amplification or oscillation analogous to that of a klystron vacuum tube.

According to the invention there is provided a device of the klystron type, comprising an array of cold-cathode field emission elements arranged to form a distributed amplifier.

The distributed amplifier may be of a travelling wave type or of a standing wave (cavity) type.

The distributed amplifier preferably comprises a modulation strip line to which an input modulation signal is applied, and a catcher strip line from which an amplified output signal is obtained. Alternatively, a modulation strip line may be provided, and electron flow in the elements may be fed back to the modulation strip line whereby the device acts as an oscillator. The feedback may be caused by bending of the electron beams in the elements under the influence of an electric field and/or a magnetic field. In the case of travelling wave amplification, the catcher strip line is preferably made of uniform impedance to minimise reflection and to allow the continuous build-up of an amplified travelling wave. Alternatively, the catcher strip line may have specific impedance discontinuities to induce reflections and to allow the build-up of an amplified standing wave with the output being provided by the residual transmission at at least one of the impedance discontinuities.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

In a device in accordance with the invention a field emission electron source preferably comprises an array of low-voltage field emitters in the form of sharp-tipped cathodes. Field emission provides an electron energy spread of about 0.25 eV, which is considerably lower than that of thermionic cathodes. A single field emitter may also tend to have a very small angular spread of emission, which is considered to result from the strong anisotropy of the work function of the emitter material. For an array comprising multiple emitter tips, unless all of the tips have identical crystallographic orientation, and therefore identical work function anisotropy, the array will probably give a large statistical spread of emission angles. In order to minimise the resulting spread of longitudinal electron velocities, a cathode/-grid structure used in the present invention preferably contains an integrated lens which produces collimation.

Figure 1:
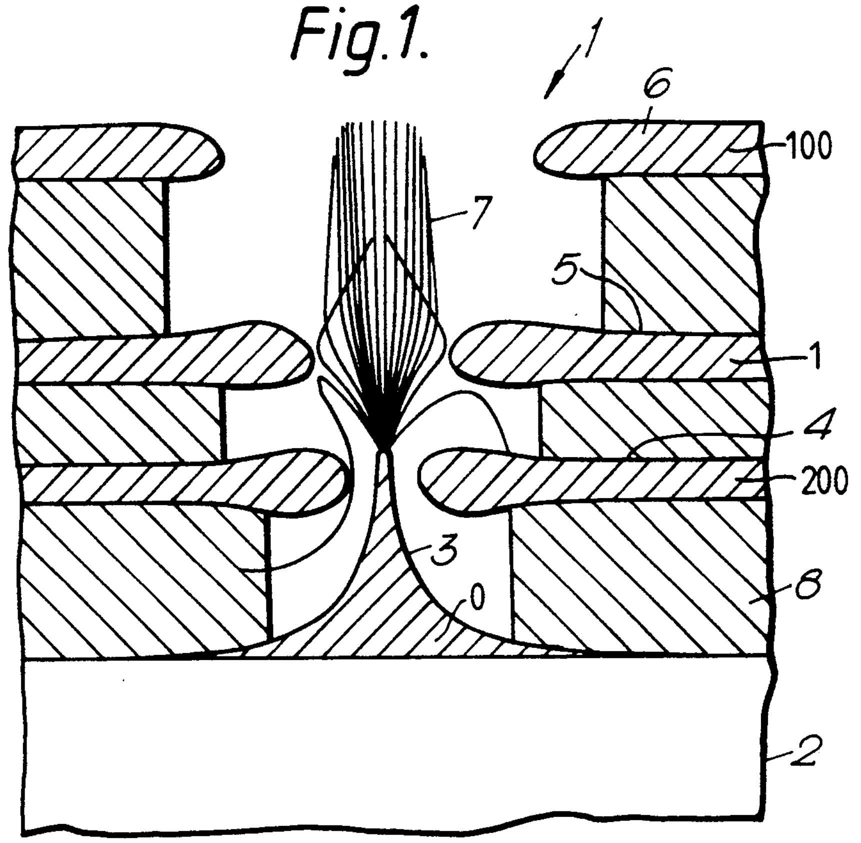
FIG. 1 shows a schematic cross-section through a field emission cathode and grid stack structure suitable for use in a klystron-type device in accordance with the invention.

FIG. 1 of the drawings shows, schematically, such a cathode/grid structure 1. The structure comprises a substrate 2 on which is formed a cathode tip 3 of, say, 2 μm height, an extraction grid 4, a lens grid 5 and an energy boosting grid 6. The grid spacings may be, for example, 1 μm. In use, the grids 4,5 and 6 might typically be biased at +200 volts, +1 volt and +100 volts, respectively, relative to the cathode tip 3, and the resulting electron trajectories 7 are indicated schematically. It will be seen that the electron beam leaving the structure is substantially collimated.

The substrate 2 may be formed of silicon, which may be coated with a metal, such as niobium, molybdenum, platinum, tungsten or gold. Many of the cathode tips are formed simultaneously in an array by masking and etching the substrate material. The cathode tips are then covered with a layer 8 of dielectric material, such as silicon dioxide, which is then planarised by etching. Alternatively, the layer 8 may be formed of other insulating material and may be of multilayer construction which may be chosen specifically to minimise problems of thermal expansion mismatch. Such layers might be, for example, of phophorus or boron-doped silicon dioxide or of silicon nitride. A conductive layer or multilayer is then formed over the dielectric layer. The layer may be of, for example, niobium, molybdenum, heavily-doped silicon or a silicon aluminium alloy. The conductive layer is then selectively masked and the unmasked areas are removed by etching, leaving a hole in the layer immediately above each tip. The remainder of the conductive layer forms the extraction grid 4. Similarly, alternate dielectric and conductive layers are deposited, and the masking and etching processes are repeated, to form the lens grid 5 and the energy boosting (accelerator) grid 6. The underlying dielectric layers are then etched by a dry., e.g. plasma, etching process, using the conductive layer as a mask, until the cathode tips are reached. Any oxide remaining immediately adjacent to each tip is then removed by a wet etching process, in order to avoid damaging the tips. Hence, the cathode tips are revealed through apertures in the dielectric and conductive layers.

Figure 2:
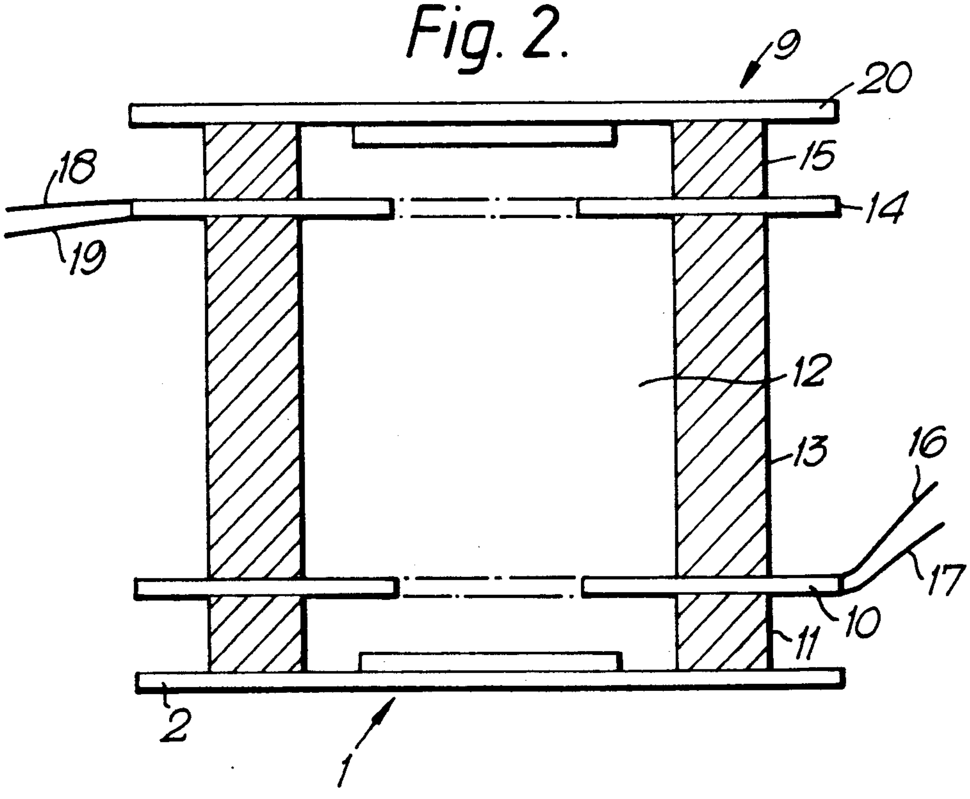
FIG. 2 shows a simplified schematic cross-section through a distributed amplifier device in accordance with the invention.

FIG. 2 shows, schematically, a cross-section through a distributed amplifier device 9 in accordance with the invention. The device preferably includes a cathode/-grid structure 1 comprising an array of cathode tips with associated grids, mounted on a substrate 2, as just described. A modulation microstrip transmission line structure 10, formed as described below, is spaced from the structure 1 by an annular dielectric spacer 11. A drift space 12 is formed within an annular dielectric spacer 13 which is bonded to the structure 10. A catcher microstrip transmission line structure 14, of similar construction to the structure 10, is mounted on the spacer 13. A collector anode 20 is spaced from the catcher line by an annular dielectric spacer 15.

A modulation input signal is fed into one end of the modulation strip line via input leads 16 and 17, and an amplified output signal is taken from the catcher stripline via leads 18 and 19.

For a given modulation frequency f, beam velocity v and velocity modulation δv produced by a signal on the modulation stripline 10, the length s of the drift space 12 for optimum beam current modulation is given approximately by $$s = \frac{v^2}{4f\delta v}$$

Hence, the required length of the device decreases with increasing frequency. For 100 GHz operation with a 200 volt electron beam amplifying a 1 mW signal on a 50 Ω modulation strip line, s is about 4 mm. For such parameters the gap between the modulation strip line and the ground plane (described below) must also be small, for example about 10 μm or a few tens of μm, so that the transit time is negligibly small compared with the signal period. This in turn requires that the 50 Ω line width shall be similarly small, for example about 100 μm or a few hundred μm. These dimensions allow monolithic integrated fabrication, but to provide sufficient current for power amplification this implies the use of a long transmission line with the cathode, modulation, drift and current pick-up distributed along it.

For this reason the catcher and modulation strip lines are matched to allow coherent distributed amplification. Due to this symmetry, it may be convenient to replace half of the drift space, the catcher and the collector anode by a retarding reflection anode to return the beam to the modulation grid, thereby producing a "reflex klystron" oscillator, as will be described below, or with an electro-static mirror or magnetic mirror to return the beam to a matched catcher strip line running parallel to the modulation stripline and on the same substrate.

Figure 3:
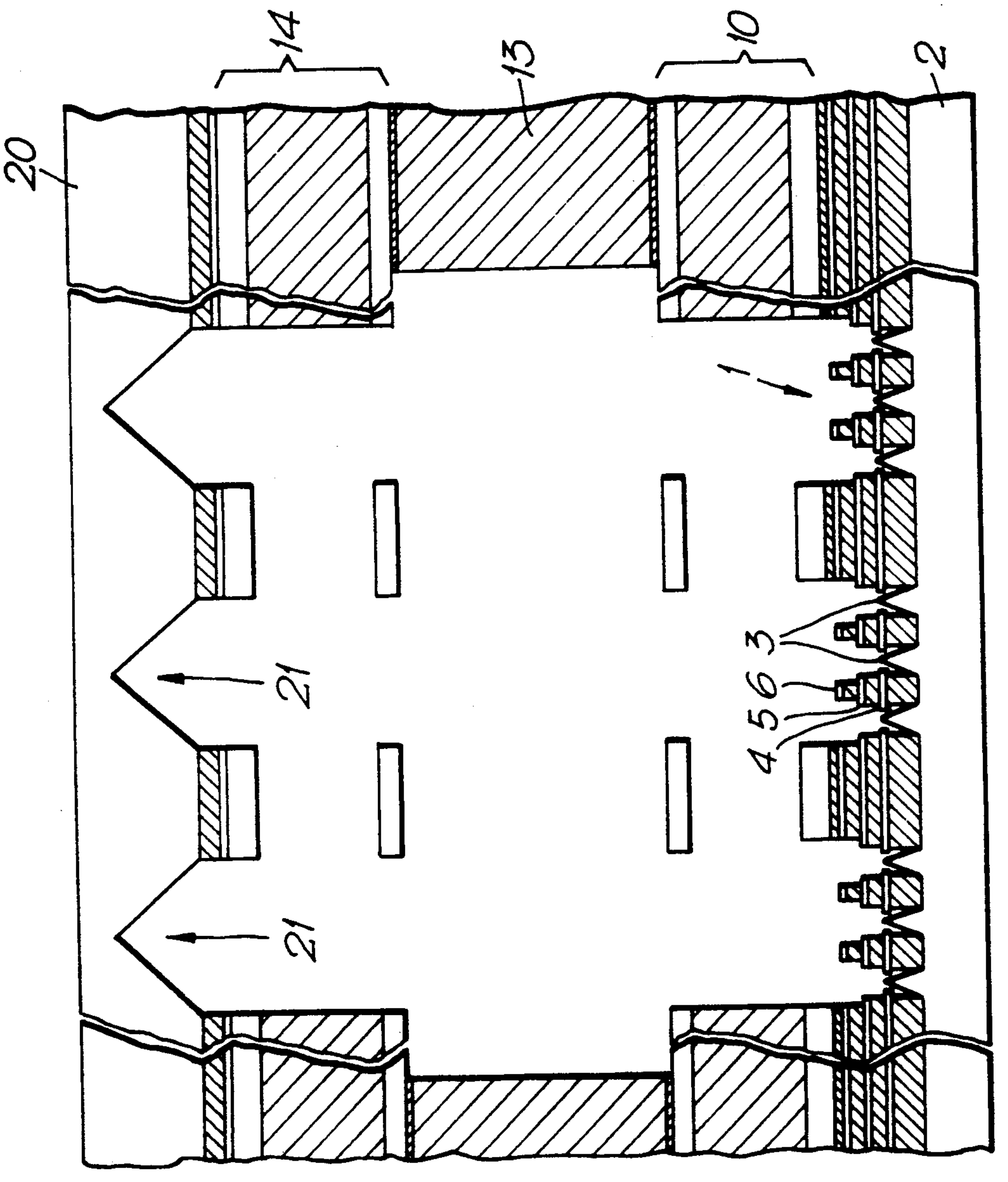
FIG. 3 shows a more detailed cross-section through the distributed amplifier device of FIG. 2.
Figure 4:
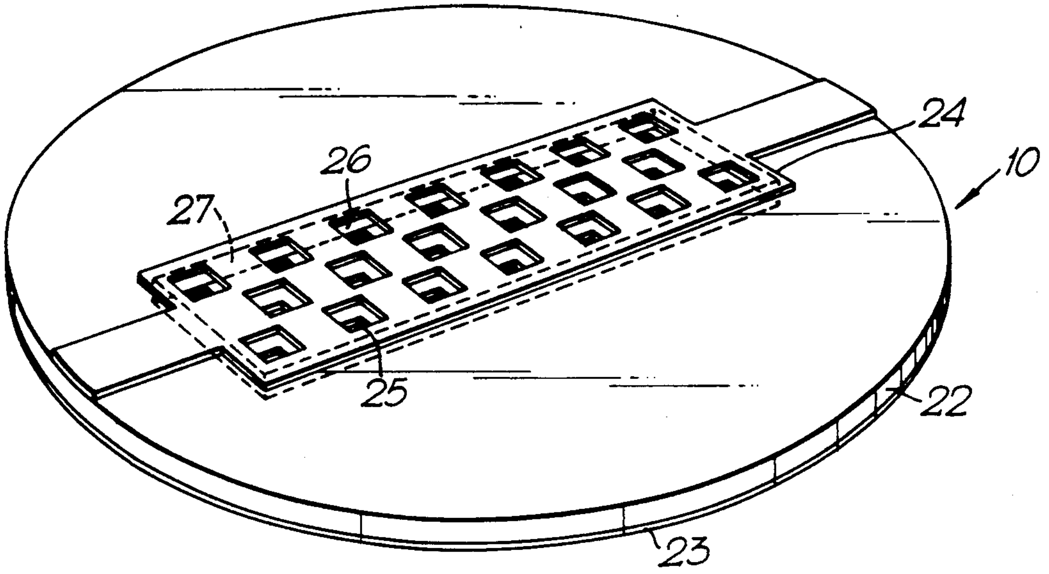
FIG. 4 shows a schematic pictorial view of a microstrip modulator or catcher line forming part of the amplifier device of FIG. 3.
Figure 5:
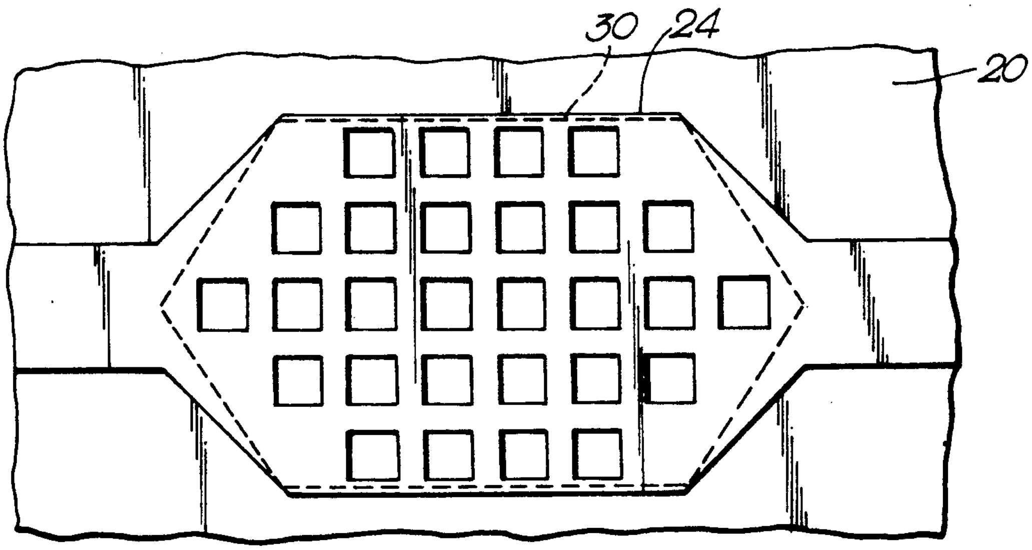
FIG. 5 is a schematic plan view of part of an alternative microstrip modulator or catcher line configuration.

FIG. 3 shows a more detailed cross-sectional view of the distributed amplifier configuration of FIG. 2. The collector anode 20 preferably has tapered cavities 21 in its surface facing the cathode tips, in order to suppress the production of secondary electrons and ions, and to allow dissipation of any residual beam energy over a larger area. Referring to FIG. 4, the modulator 10 comprises a disc 22 of insulating material, which is preferably insulating (intrinsic or compensated) silicon for ease of fabrication, but which may be, for example, sapphire or quartz. A layer 23 of high-conductivity metal, such as gold possibly with a layer of chromium thereunder as an adhesion layer, is deposited to a thickness of, say, 0.5 μm over the whole of one surface of the disc 22 to act as a ground plane. A microstrip line 24 of approximately 50 Ω impedance is formed on the opposite surface of the disc. The line 24 is similarly formed of gold on chromium. Aligned apertures 25,26 are forced through the metal layers 23,24, respectively, by masking and etching. The major part of the area of the disc 20 beneath the microstrip line is then etched away, leaving an aperture 27 in the disc, with the stripline just supported around its edges. The spacing of the modulator 10 from the cathode tips is not critical, and although the grid 6 might be in contact with the modulator 10, in practice it may be spaced up to, say, a millimetre from that grid. Since the gap between the modulator strip line and the ground plane is about 10 μm or a few tens of μm to minimise transit time delay, the apertures can be, say, 10 μm square and can be aligned over several tips. FIG. 5 shows an alternative configuration for the microstrip line 24 which has tapered regions to obtain an approximately uniform 50 Ω impedance. The aperture 30 through the disc 20 also has tapered ends, but the subtended angles between the aperture ends are larger than those of the strip line, so that greater support is provided for the broadening strip line.

The spacer 13 (and possibly the spacers 11,15) preferably comprises a sodium glass ring which is bonded by an electrostatic bonding technique to the modulator 10 to form a vacuum-tight seal therebetween.

The catcher microstrip line 14 may be of similar construction to the modulator 10, and may be inverted so that its ground plane is adjacent the collector anode 20. This structure is also bonded to the spacer 13.

Figure 6:
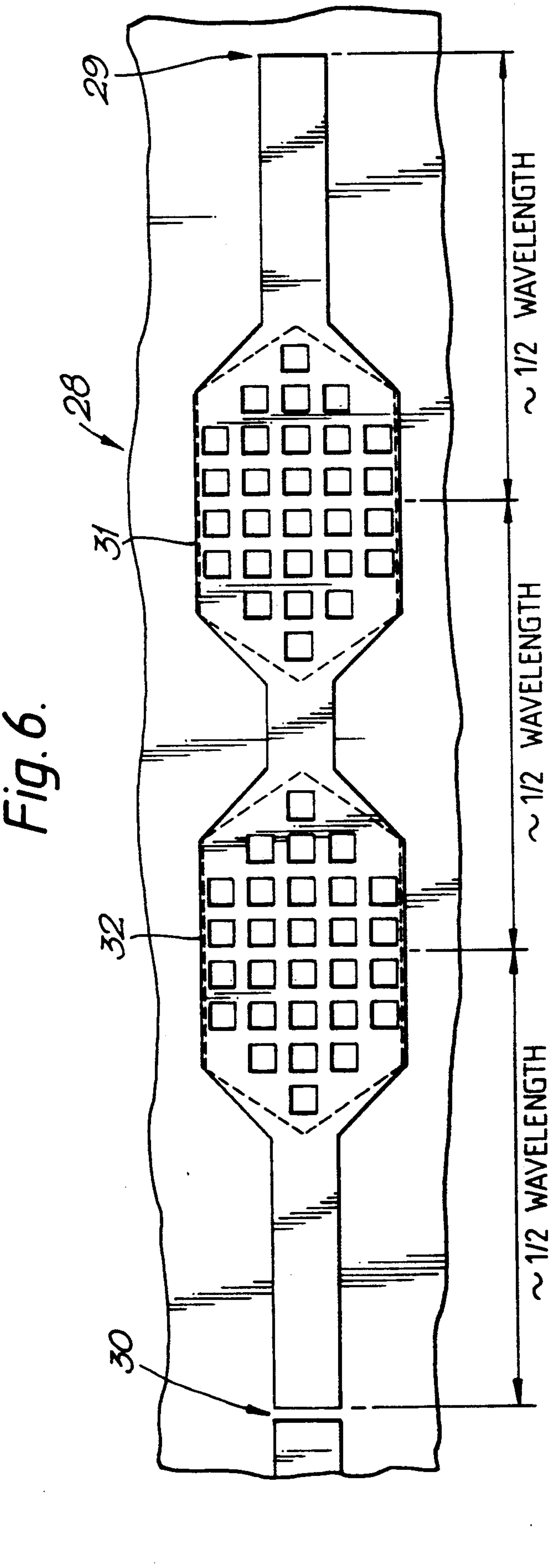
FIG. 6 is a schematic plan view of an alternative catcher line configuration for standing wave amplification.

An alternative catcher line configuration is shown in FIG. 6. Because the current modulation produced at the plane of the catcher transmission line is highly non-sinusoidal, this amplifier or oscillator will produce a range of harmonics of the input frequency. It may therefore be convenient to tune the output using a tuned cavity with a sufficiently high Q value to suppress higher harmonics i.e. to use a standing wave geometry rather than a travelling wave geometry. Typically, such a cavity could be forced by including partially reflecting local deviations in the catcher line impedance. For example, the catcher line 28 could be terminated at one end 29 by an open circuit and could include a partially-transmitting discontinuity 30 spaced from the end 29 by such a distance as to obtain a standing wave mode between the discontinuity 30 and the end 29. The modulator strip line is preferably of the same configuration as the catcher line. Separate patches of active cathode area are addressed by patches 31,32 of modulator/catcher strip line. These patches are spaced by approximately ½ wavelength because no net amplification would be achieved by electron beam coupling at the intervening nodes.

Preferably all of the components of the described devices are bonded together in such a manner as to form a vacuum-tight enclosure in which electrons from the cathode tips 3 travel to the collector anode 20. Alternatively, the device may be mounted in a further enclosure (not shown) which is itself vacuum-tight.

Figure 7:
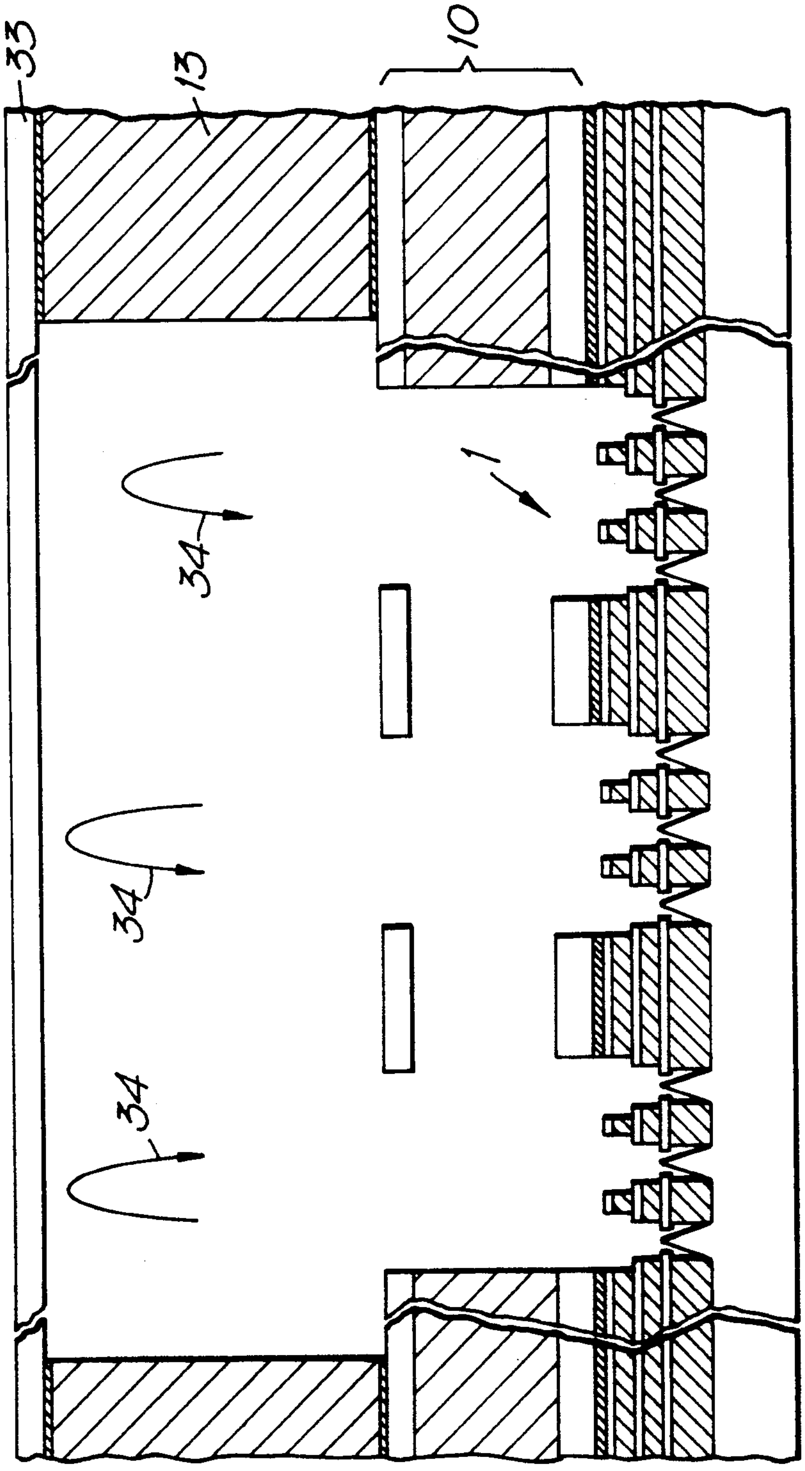
FIG. 7 shows a schematic cross-section through an oscillator device in accordance with the invention.

FIG. 7 shows, schematically, a klystron-type oscillator device. In this case, as mentioned previously, the catcher line 14 and the collector anode 20 of FIG. 3 are omitted, and a reflector electrode 33 is bonded to the spacer 13. In use of the device, the electrode 33 is biased negatively with respect to the cathode potential, the reflector electrode to cathode voltage being, for example, −10 volts. This electrode electron beams such as those schematically represented by arrows 34, to turn back towards the modulator 10, thereby producing feedback which causes the device to oscillate. Variation of the voltage on the reflector electrode will alter the transit times of the electrons, and can therefore enable tuning of the oscillation frequency of the device.

Alternatively, or additionally, a magnetic field may be applied transversely to the general direction of electron flow to cause reversal of the electron beams. Again, the magnitudes of the electric and/or magnetic fields will determine the oscillation frequency.

Figure 8:
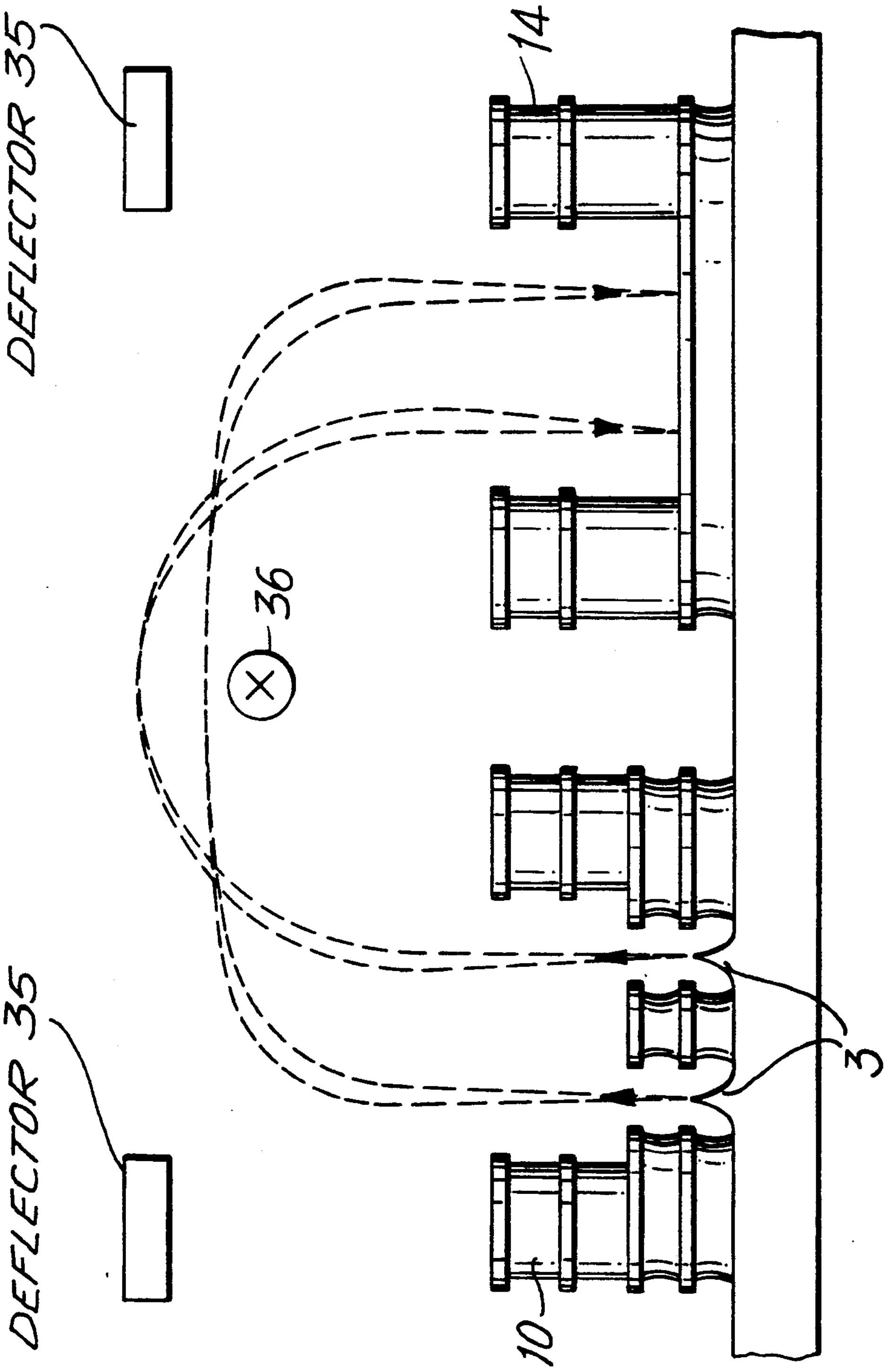
FIG. 8 shows a schematic cross-section through an alternative form of device in accordance with the invention.

In an alternative arrangement in FIG. 8, the catcher strip line 14 is mounted alongside the modulator 10, and the electron beams are bent, by an electric field applied by a deflector 35 and/or a magnetic field applied by an electromagnetic source 36 above, so that they reach the catcher line via curved paths. The catcher and modulator lines may be coupled together so that feedback occurs, causing oscillation of the device. Again, adjustment of the electric and/or magnetic field strength will vary the tuning of the device.

Although the cathode/grid structure in each embodiment described above includes three grid electrodes, this number may be reduced to two or one if additional collimation of the electron beams is not required.

The catcher and modulator strip lines 10 and 14 may be identical in configuration and construction.

Whereas the embodiments described above include a silicon substrate with or without a metallic coating, alternatively a substrate of metal, particularly but not exclusively a single crystal metal, may be used.

We claim:

1. A distributed amplifer device, comprising an array of field emitter cathode bodies on a substrate; a grid structure comprising a plurality of grid electrodes formed over, and insulated from, the cathode bodies and from each other; a modulation microstrip line attached to the grid structure and spaced from the grid electrodes; spacer means attached to the modulation line and forming an electron drift space therein; and a catcher microstrip line attached to the spacer means.

2. A device as claimed in claim 1, further comprising electron collector means for receiving electrons which have passed through the catcher microstrip line.

3. A device as claimed in claim 1 wherein at least one of the modulation and catcher lines comprises a plate of insulating material having a layer of electrically-conductive material over one major surface to form a ground plane, a region of electrically-conductive material on the opposite surface, and apertures therethrough for passage of electrons emitted by the cathode bodies.

4. A device as claimed in claim 3, wherein the electrically-conductive material is gold.

5. A device as claimed in claim 1, wherein the components are sealed together to form a vacuum-tight enclosure.

6. The klystron distributed amplifier device, comprising an array of cold-cathode elements for emitting electrons by field emission; a modulation strip line spaced from said array for modulating the emitted electrons in response to an input modulation signal fed to said modulation strip line; and a catcher strip line spaced from the modulation strip line to provide an amplified output signal.

7. A device as claimed in claim 6, wherein the catcher strip line is mounted alongside the modulation strip line; and deflector means is provided to cause bending of the paths of electrons emitted by the array so that said electrons reach the catcher strip line.

8. A device as claimed in claim 7, wherein the catcher strip line and the modulation strip line are coupled together.

9. A device as claimed in claim 6, including a collector electrode spaced from the catcher strip line.

10. A device as claimed in claim 9 wherein the collector electrode has recesses in its surface facing the catcher strip line to reduce the generation of secondary electrons.

11. A device as claimed in claim 6, wherein each cold-cathode field emission element comprises at least one tapered cathode body.

12. A device as claimed in claim 11, wherein each element further comprises at least one grid electrode spaced from the cathode body.

13. A device as claimed in claim 12, wherein each element further comprises a plurality of grid electrodes.

14. A device as claimed in claim 13, wherein the grid electrodes are common to all of the elements and comprise a stack of spaced-apart electrically-conductive layers.

15. A device as claimed in claim 11, wherein the cathode bodies are tapered portions protruding from a substrate.

16. A klystron oscillator device, comprising an array of cold-cathode elements for emitting electrons by field emission; a modulation strip line spaced from the array for modulating the emitted electrons; and deflector means for returning electrons emitted by said array to the modulation strip line to cause oscillation of the device.

17. A device as claimed in claim 16 wherein the deflector means includes means to apply a variable field to the emitted electrons to adjust the frequency of oscillation of the device.

* * * * *